US006933561B2

(12) United States Patent
Katsumata et al.

(10) Patent No.: US 6,933,561 B2
(45) Date of Patent: Aug. 23, 2005

(54) SEMICONDUCTOR DEVICE AND METHOD OF MANUFACTURING THE SAME

(75) Inventors: Ryota Katsumata, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/814,266

(22) Filed: Apr. 1, 2004

(65) Prior Publication Data

US 2005/0151191 A1 Jul. 14, 2005

(30) Foreign Application Priority Data

Jan. 14, 2004 (JP) ............................ 2004-006927

(51) Int. Cl.[7] ........................ H01L 29/76; H01L 29/94; H01L 31/062; H01L 31/113; H01L 31/119

(52) U.S. Cl. ....................... 257/336; 257/344; 257/408

(58) Field of Search ................................ 257/336, 344, 257/408, 900

(56) References Cited

U.S. PATENT DOCUMENTS 4,366,613 A 1/1983 Ogura et al.
6,580,149 B2 6/2003 Tran et al.

*Primary Examiner*—Thien F Tran
(74) *Attorney, Agent, or Firm*—Oblon, Spivak, McClelland, Maier & Neustadt, P.C.

(57) ABSTRACT

A semiconductor device includes a post-oxide film comprising first, second and third portions. The first portion extends on the sidewall of a gate electrode provided on a gate insulating film on the surface of the semiconductor substrate to the surface of the semiconductor substrate. The second portion extends on the surface of the semiconductor substrate and contacts with the first portion. The third portion extends on the surface of the semiconductor substrate with its end contacting with an end of the second portion opposite to the first portion and is thinner than the second portion. A spacer covers the first portion on the second and third portions. Source/drain extension layers, in the surface of the semiconductor substrate, sandwich a channel region under the gate electrode. Source/drain diffusion layers, in the surface-of the semiconductor substrate, contact with ends of the source/drain extension layers opposite from the channel region.

7 Claims, 9 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-006927, filed Jan. 14, 2004, the entire contents of which are incorporated herein by reference.

BACKGROUND OF THE INVENTION

1. Field of the Invention

The present invention relates to a semiconductor device and more specifically to the structure of array transistors and peripheral transistors (transistors in peripheral circuits) of an embedded or a consumer used dynamic random access memory (DRAM) and a method of manufacturing such a device.

2. Description of the Related Art

FIG. 17 depicts, in a sectional view, the structure of an array transistor which forms a part of a memory cell of a DRAM and a peripheral transistor which forms a part of a peripheral circuit. Each of the transistors is a metal oxide semiconductor field effect transistor (MOSFET, hereinafter referred to simply as a transistor). As shown in FIG. 17, a gate electrode 103 is located on a gate insulating film 102 formed on the surface of a semiconductor substrate 101. A post-oxide film 104 is comprised of a portion 104*a* located on the sidewall of the gate electrode 103 and a portion 104*b* located on the semiconductor substrate 101 by the side of the gate electrode 103. A spacer 105 on the post-oxide film 104*a* covers the sidewalls of the gate electrode 103 and the sidewalls of a silicide film 106 and an insulating film 107 which are located on the gate electrode 103. Source/drain extension layers 108 are formed in portions of the surface of the semiconductor substrate 101 which are located immediately under the portion 104*b* of the post-oxide film 104.

In order to suppress the short-channel effect of the transistor, it is required to form thin extension layers. The extension layers 108 are formed by means of ion implantation through the post-oxide film 104*b*; thus, if the post-oxide film 104*b* is thin, the controllability of ion implantation increases, allowing the extension layers 108 to be formed thin with ease. In particular, with peripheral transistors for which the demand for high performance is increasing, to suppress the short-channel effect, it is advisable that the post-oxide film 104 be thin.

In order to reduce electric fields at the lower corners of the gate electrode 103, it is necessary to make the post-oxide film 104*a* thick. For instance, it is required that the post-oxide film 104*a* be thicker than the gate insulating film 102. This is because control of the thickness of the post-oxide film 14*a* allows the lower corners of the gate electrode 103 to become rounded, thereby reducing the electric field at the lower corners. In view of the fact that contact of a insulating film to the semiconductor substrate 101 prevents tunneling of electrons between bands, it is also required the thickness of the post-oxide film 104*a* be 10 nm or more at least in the vicinity of the gate electrode 103. With DRAM array transistors in particular, it is desirable that the post-oxide film 104 be thick in order to reduce the electric field at the corners of the gate electrode 103 for the aim of improving data retention characteristics.

In determining the thickness of the post-oxide film 104, the peripheral transistors have to be constructed to conform to the array transistors because the performance of the array transistors is given preference over the performance of the peripheral transistors. That is, the thickness of the post-oxide film 104 is set to thicknesses required of the array transistors. As a consequence, it becomes impossible to improve the performance of the peripheral transistors.

BRIEF SUMMARY OF THE INVENTION

According to a first aspect of the present invention, there is provided a semiconductor device comprising: a semiconductor substrate; a gate electrode provided on a gate insulating film formed on the surface of the semiconductor substrate; a post-oxide film comprising a first portion, a second portion and a third portion, the first portion extending on a sidewall of the gate electrode to the surface of the semiconductor substrate, the second portion extending on the surface of the semiconductor substrate and contacting with the first portion, the third portion extending on the surface of the semiconductor substrate with its end contacting with an end of the second portion opposite to the first portion and thinner than the second portion; a spacer covering a sidewall of the first portion on the second portion and the third portion; source/drain extension layers formed in the surface of the semiconductor substrate under the second portion and/or third portion and sandwiching a channel region under the gate electrode; and source/drain diffusion layers formed in the surface of the semiconductor substrate and contacting with ends of the source/drain diffusion opposite from the channel region.

According to a second aspect of the present invention, there is provided a method of manufacturing a semiconductor device having an array transistor that forms a part of a memory cell formed in an array transistor area and a peripheral transistor that forms a part of a peripheral circuit formed in a peripheral area, comprising: forming a gate electrode on a gate insulating film on the surface of a semiconductor substrate in the array transistor area and the peripheral area; forming a first post-oxide film on the sidewall of the gate electrode in the array transistor area and the peripheral area; forming first source/drain extension layers in the surface of the semiconductor substrate in the array transistor area, the first source/drain extension layers sandwiching a channel region below the gate electrode; forming a second post-oxide film on the surface of the semiconductor substrate in the vicinity of the gate electrode so that it comes into contact with the first post-oxide film; forming second source/drain extension layers in the surface of the semiconductor substrate in the peripheral area by ion implantation through the second post-oxide film and a third post-oxide film formed on the semiconductor substrate, the third post-oxide film contacting with ends of the second post-oxide film opposite from the first post-oxide film; and forming source/drain diffusion layers in the surface of the semiconductor substrate in the array transistor area and the peripheral area, the source/drain diffusion layers contacting with ends of the first and second source/drain extension layers opposite from the channel region.

BRIEF DESCRIPTION OF THE SEVERAL VIEWS OF DRAWING

Figure 1:
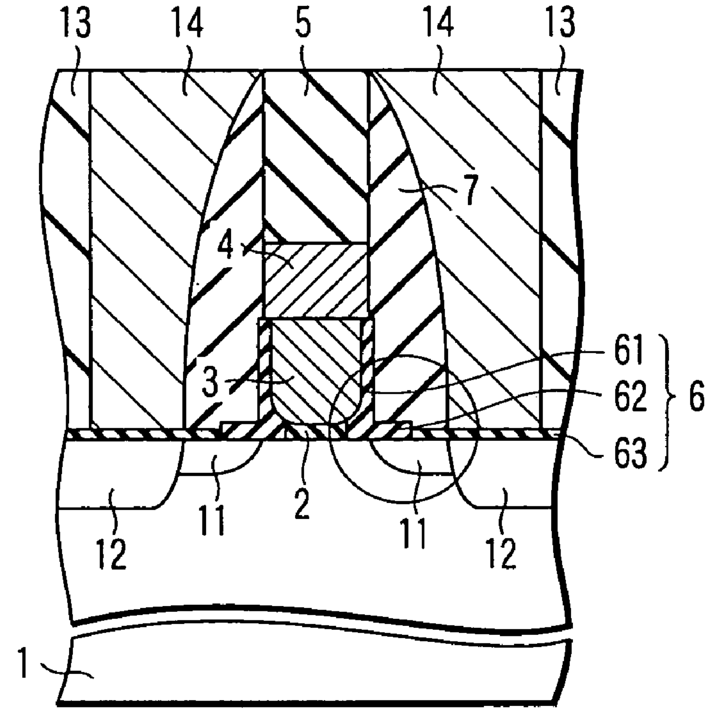
FIG. 1 is a sectional view of a semiconductor device according to a first embodiment of the present invention.
Figure 11:
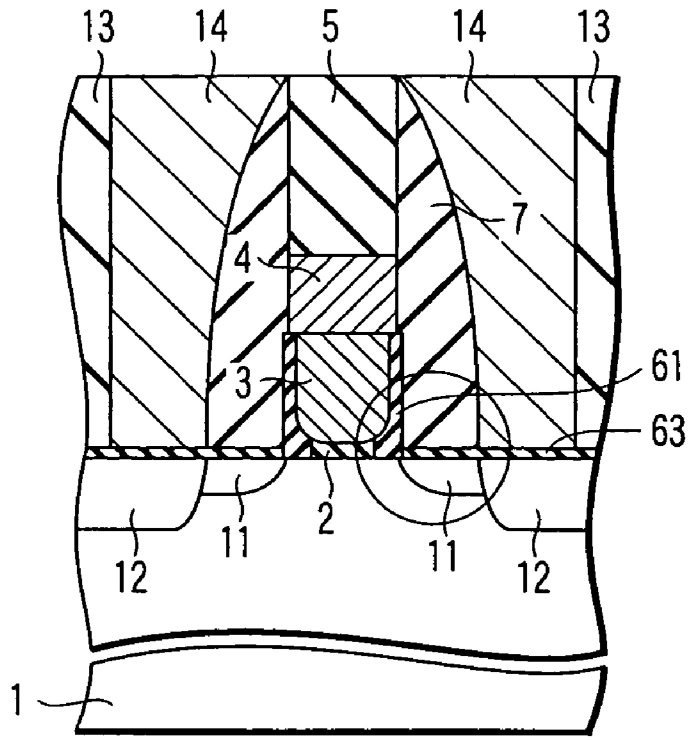
Figure 12:
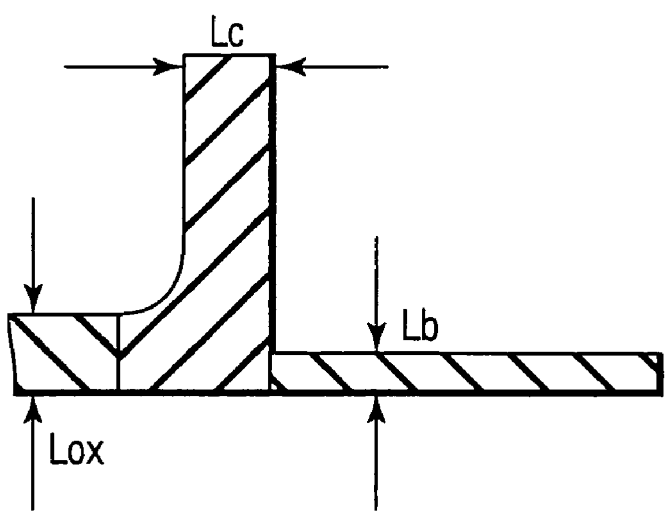
Figure 15:
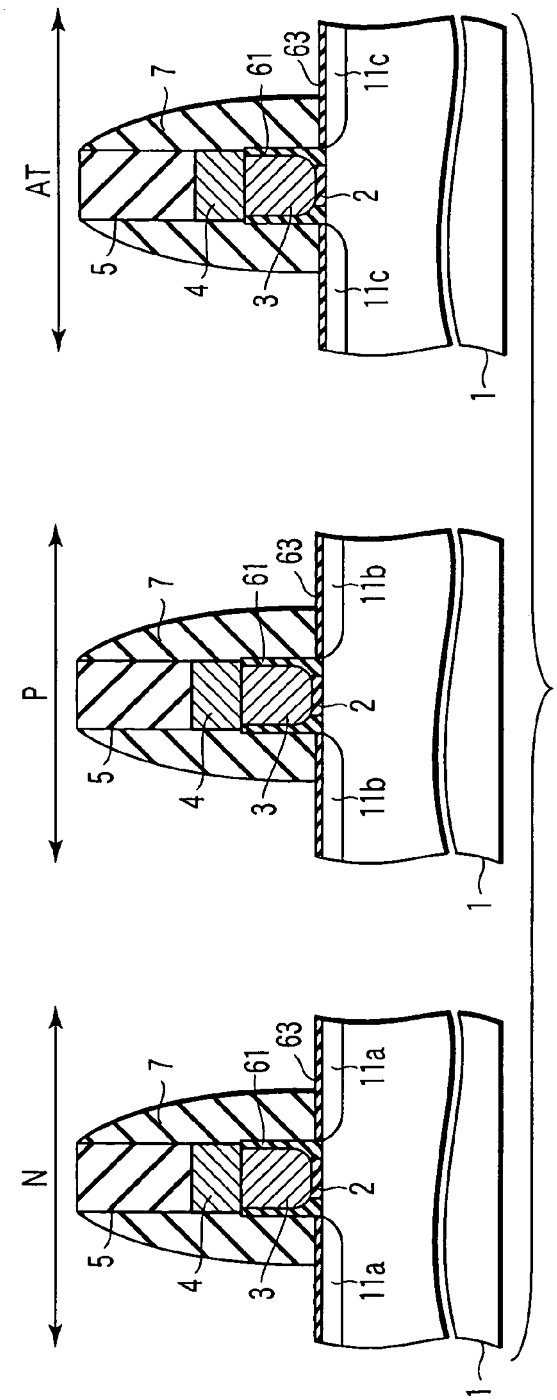
Figure 16:
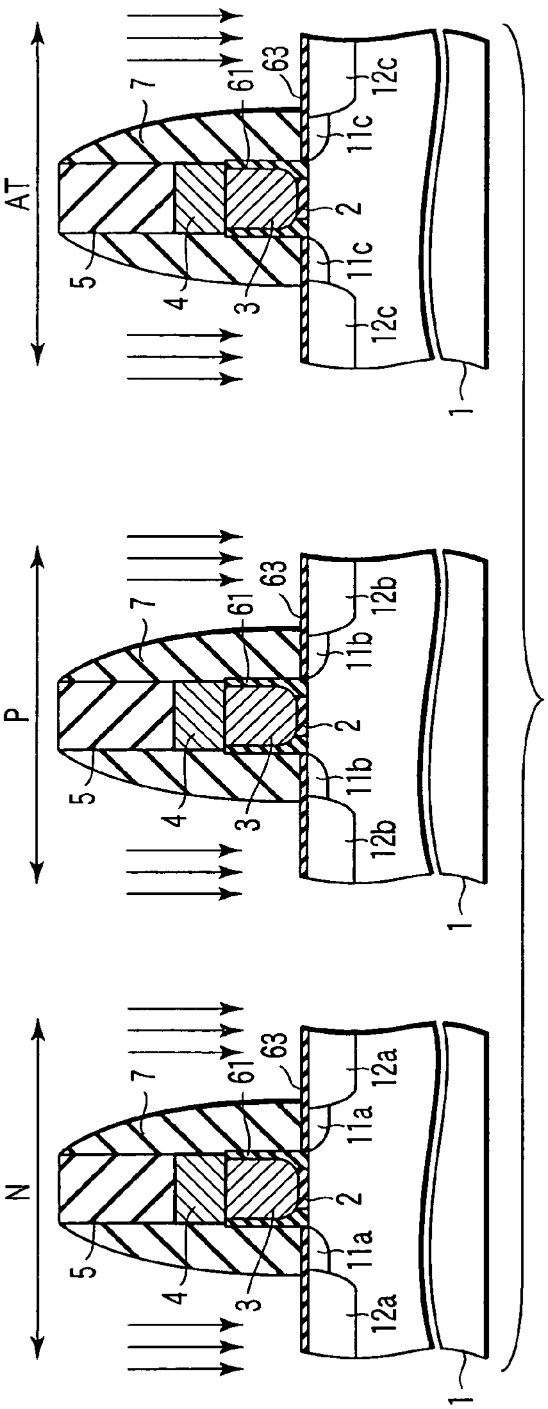
Figure 17:
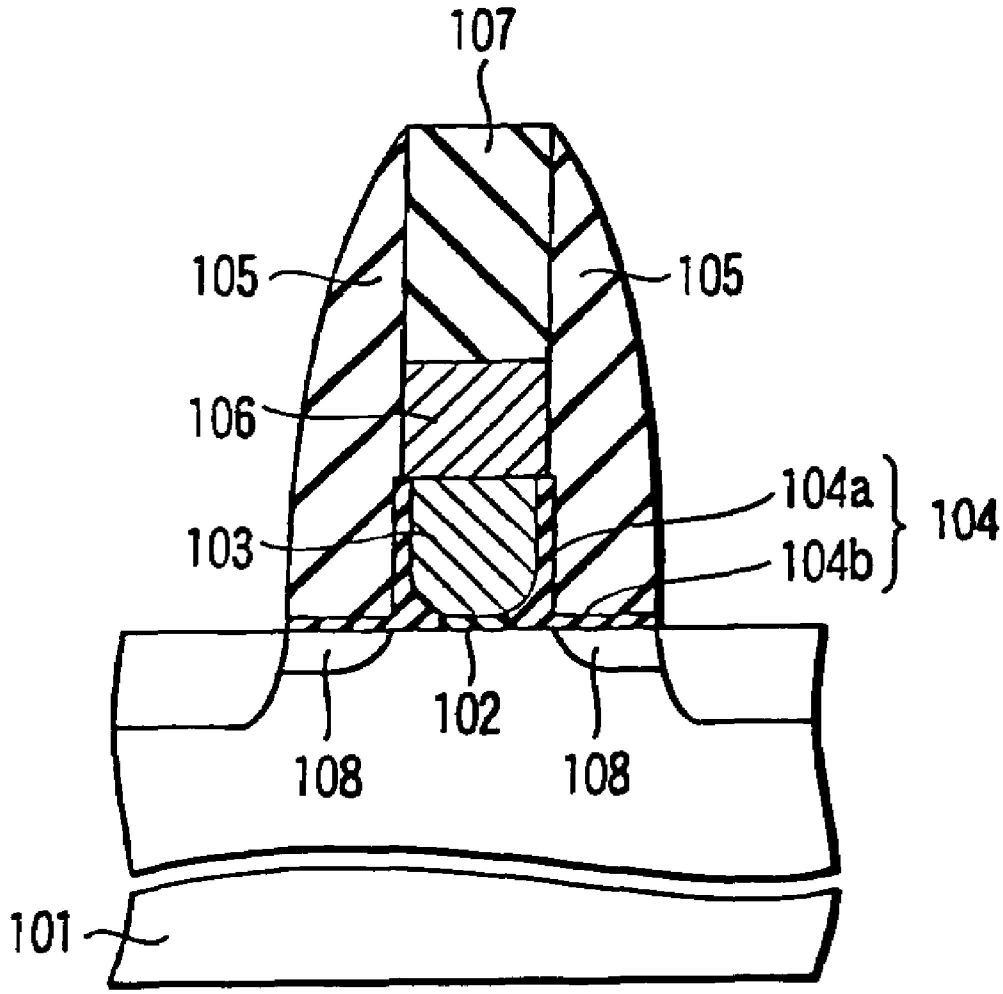

FIGS. 3, 4, 5, 6, 7, 8, 9, and 10 are sectional views, in the order of steps of manufacture, of the semiconductor device of FIG. 1;

FIG. 11 is a sectional view of a semiconductor device according to a second embodiment of the present invention;

FIG. 12 is an enlarged sectional view of a portion of the semiconductor device of FIG. 11;

FIGS. 13, 14, 15, and 16 are sectional views, in the order of steps of manufacture, of the semiconductor device of FIG. 11; and FIG. 17 is a sectional view of a conventional semiconductor device.

DETAILED DESCRIPTION OF THE INVENTION

Embodiments of the present invention will be described below with reference to the accompanying drawings. In the following description, the same reference numerals are given to constituent components having substantially the same function and configuration, and overlapping explanation will only be made if necessary.

First Embodiment

Figure 2:
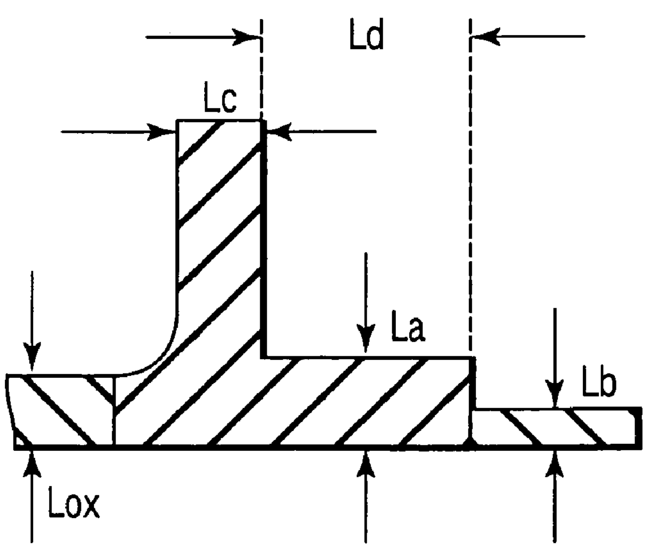
FIG. 2 is an enlarged sectional view of a portion of the semiconductor device of FIG. 1.

A semiconductor device according to a first embodiment of the present invention will be described below with reference to FIGS. 1 and 2. FIG. 1 is a schematic sectional view of the semiconductor device of the first embodiment. The semiconductor device of the first embodiment includes array transistors each of which forms a part of a memory cell and peripheral transistors each of which forms a part of a peripheral circuit. The peripheral transistors include n-type MOS transistors and p-type MMOS transistors. Each of the transistors has substantially the same geometry; therefore, only one transistor is illustrated in FIG. 1. In FIG. 2 there is shown enlarged the portion of FIG. 1 enclosed by a circle.

As shown in FIGS. 1 and 2, a semiconductor substrate 1 is formed on top with a gate insulating film 2. The semiconductor substrate is made of, for example, silicon. A gate electrode (n-type polysilicon) 3, a silicide film 4 of tungsten silicide (WSi) and a cap insulating film 5 of silicon nitride (SiN) are formed in sequence on the gate insulating film 2. A post-oxide film 6 is formed to extend from the top edge of the sidewall of the gate electrode 3 to the surface of the semiconductor substrate 1 as shown and composed of first, second and third portions 61, 62 and 63. The first portion 61 of the post-oxide film 6, the silicide film 4 and the cap insulating film 5 is covered with a spacer 7 on their side. The lower portion of the spacer 7 covers the whole of the second portion 62 and a part of the third portion 63.

Source/drain extension layers (hereinafter referred to as extension layers) 11 to form the lightly doped drain (LDD) structure are formed in the surface of the semiconductor substrate 1. The extension layers sandwich a channel region below the gate electrode 3. A source/drain diffusion layer 12 is formed at the opposite end of each extension layer from the channel region.

An interlayer insulating film 13 is formed over the entire surface of the semiconductor substrate 1. Contacts 14 are formed in the interlayer insulating film 13 to connect the corresponding source/drain diffusion layer 12 to bit lines. The contact 14 is formed by a self-aligned contact. In a section different from the section of FIG. 1 in the direction in which the gate electrode 3 extends (the direction normal to the drawing sheet), a portion of the cap insulating film 5 is removed and a contact is formed in the film-removed position (not shown).

Next, each part of the semiconductor device will be described in more detail. The gate insulating film 2, which consists of, for example, SiO, has a thickness Lox which should be within the range of 1 to 20 nm, and preferably within the range of 3 to 10 nm, and more preferably 7 nm. The gate electrode 3 consists of, for example, polysilicon and is rendered electrically conducting by incorporation of impurities. The gate electrode is, for example, 80 nm in thickness (height) and, for example, 100 nm in width (length in the direction of channel length). The lower corners of the gate electrode 3 each have a rounding corresponding to the geometry determined by the thickness of the gate insulating film 2 and the thickness of the first portion 61 of the post-oxide film 3. Causing the gate electrode 3 to have rounded corners allows the concentration of electric field in these portions to be reduced. As a result, it is possible to suppress the tunneling of electrons between bands resulting from the neighborhood of the extension layer 11 being depleted by gate-electric field at transistor off time. In other words, it is possible to prevent the leakage current between the gate electrode 3 and the semiconductor substrate 1 from increasing.

The silicide film 4 has a thickness of, for example, 60 nm. The cap insulating film 5 has a thickness of, for example, 200 nm. The silicide film 4 and the cap insulating film 5 are equal in width to the gate electrode 3.

The post-oxide film 6 is a silicon oxide film formed by, for example, thermal oxidation and natural oxidation. The first portion 61*a* covers the sidewall of the gate electrode 3 and its lower end reaches the surface of the semiconductor substrate 1. The second portion 62 is located on the surface of the semiconductor substrate 1 and contacts the first portion 61 at its one end. Actually, the second portion 62 is integral with the first portion 61. The third portion 63 is located on the surface of the semiconductor substrate 1 so that it comes into contact the opposite end of the second portion 62 from the first portion 61.

The thickness La of the second portion 62, which is greater than the thickness Lox of the gate electrode 2, should be within the range of 1 to 50 nm, and preferably within the range of 5 to 20 nm, and more preferably 10 nm.

The length-Ld of the second portion 62 from its one end to the other should be within the range of 1 to 30 nm, and preferably within the range of 2 to 10 nm and more preferably 5 nm or less. One of the reasons for such length settings of the second portion is that, since ion implantation is performed through the second and third portions 62 and 63 as will be described later, the controllability increases as the second portion 62 which is thick becomes smaller in area.

The thickness La of the second portion 62 is less than the width Lc of the first portion 61. Although the first and second portions 61 and 62 are formed by one thermal oxidation step as will be described later, the width Lc and the thickness La differ from each other. This is because polysilicon that forms the gate electrode 3 and silicon that forms the semiconductor substrate 1 differ in oxidation rate.

Ideally, the third portion 63 should be absent. This is because the ion implantation under the condition that the third portion 63 is not formed results in more increased controllability. However, the third portion 63 is formed by natural oxidation and its thickness Lb should be within the range of 0.1 to 10 nm and is preferably within the range of 0.1 to 5 nm and more preferably 1 nm.

The spacer 7 is formed from, for example, SiN because, in the array transistor area, a contact hole for the contact 14 is formed by self-aligned contact. The lower portion of the spacer 7 covers the whole of the second portion 62 and a part of the third portion 63. The area occupied by the transistor can be reduced by decreasing the width of the spacer 7. The length of the extension layer 11 is determined by the width of the spacer 7. In view of these points, the width of the spacer 7 is set to, for example, 50 to 30 nm.

The extension layer 11 extends from under the first portion 61 of the post-oxide film to under the edge of the spacer 7. The source/drain diffusion layers 12 are formed deeper than the extension layers 11 and have a higher impurity concentration than the extension layers. The interlayer insulating film 13 is formed from, for example, boron phosphorous silicate glass (BPSG).

A method of manufacturing the semiconductor device shown in FIG. 1 will be described next with reference to FIG. 3 through FIG. 10, which are sectional views, in the order of steps of manufacture, of semiconductor devices each having the same structure as the semiconductor device of FIG. 1. An n-type transistor and a p-type transistor, each of the same structure as the transistor of FIG. 1, are formed in an n-type transistor area N and a p-type transistor area P, respectively. An array transistor of the same structure as shown in FIG. 1 is formed in an array transistor area AT. In the description which follows, when need arises to make a distinction between the n-type, p-type and array transistors for each element of the transistor, a subscript a, b, or c is appended to the corresponding reference numeral in FIG. 1.

First, though not shown, a device isolation insulating film of the shallow trench isolation (STI) structure is formed on the surface of the semiconductor substrate 1. Next, ion implantation is performed on an area where a channel is to be formed and a well (not shown) is then formed.

Figure 3:
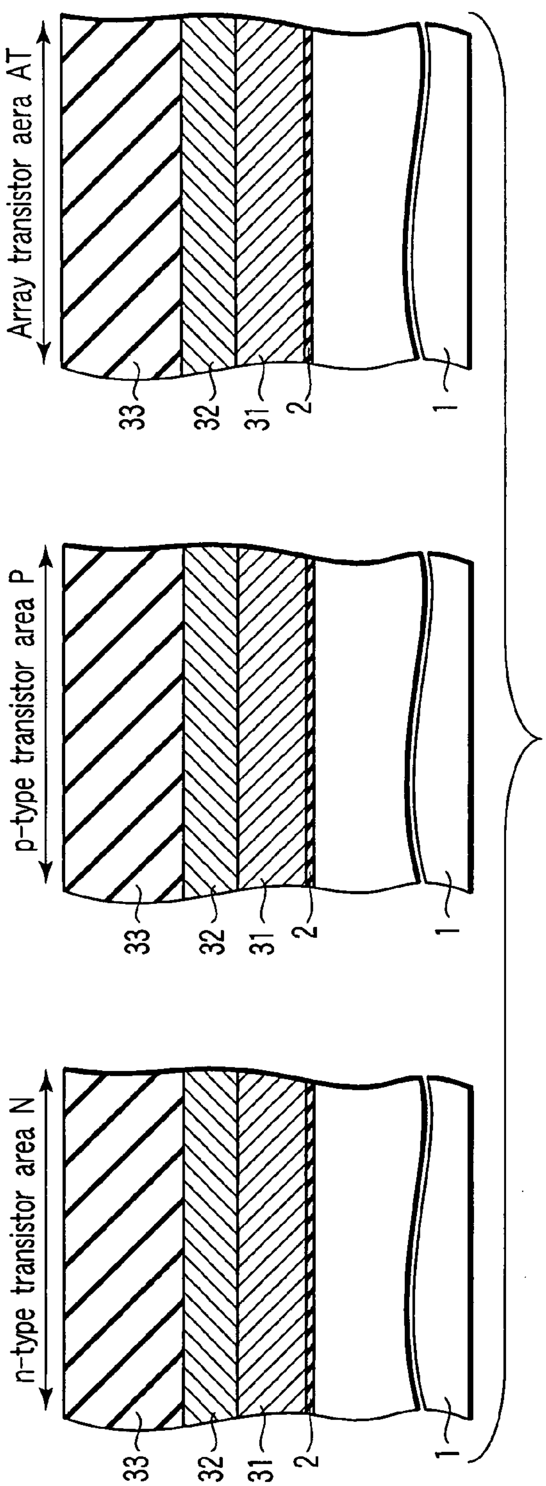

Next, as shown in FIG. 3, the gate insulating film 2 is formed over the entire surface of the semiconductor substrate 1 by means of thermal oxidation. Then, a film 31 of a material for the gate electrode 3 is deposited on the gate insulating film 2 by means of chemical vapor deposition (CVD). After that, ions of P, B, etc. are implanted into the material film 31 to define the conductivity type of each transistor. Alternatively, a P-doped film may be deposited instead of performing ion implantation. A material film 32 of a material for the silicide film 4 is then formed on the material film 31 by means of sputtering. A material film 33 of a material for the cap insulating film 5 is then formed on the material film 32 by means of low pressure CVD (LPCVD).

Figure 4:
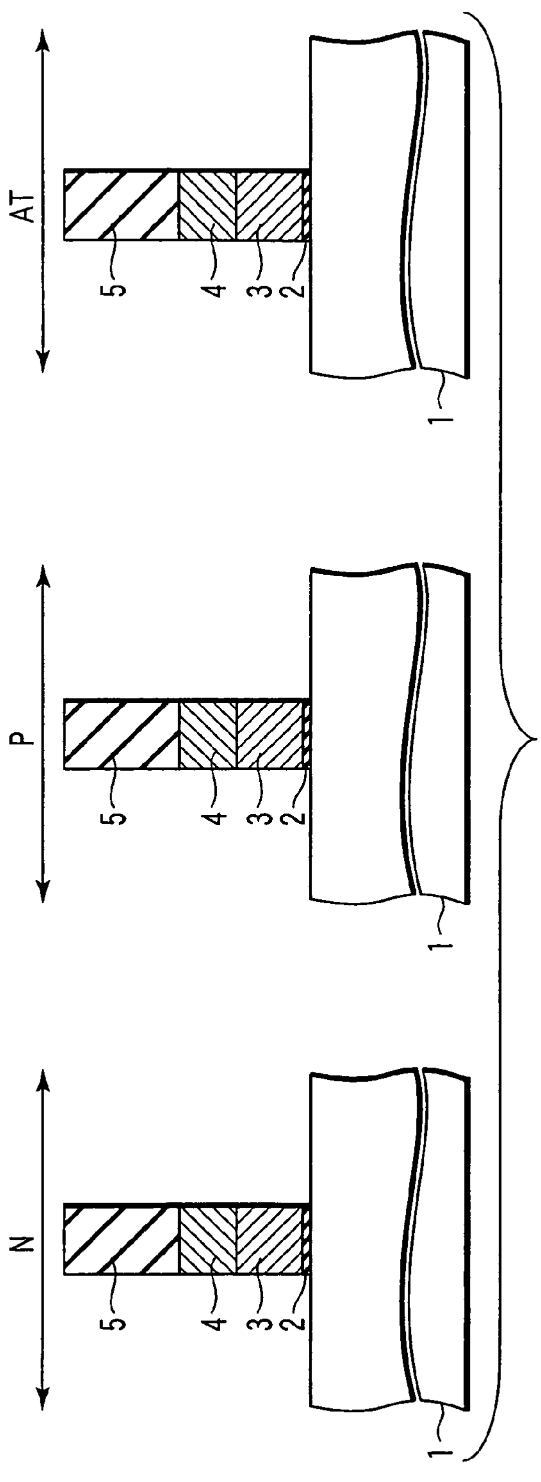

Next, as shown in FIG. 4, by means of lithography and anisotropic etching such as RIE, the material film 33 is patterned to form the cap insulating film 5 that defines gate electrode areas. Using the patterned cap insulating film 5 as a mask, the material films 32 and 31 are then patterned by means of anisotropic etching such as RIE. As a result, the gate electrode 3 and the silicide film 4 are formed. At this point, the gate insulating film 2 is left only under the gate electrodes.

Figure 5:
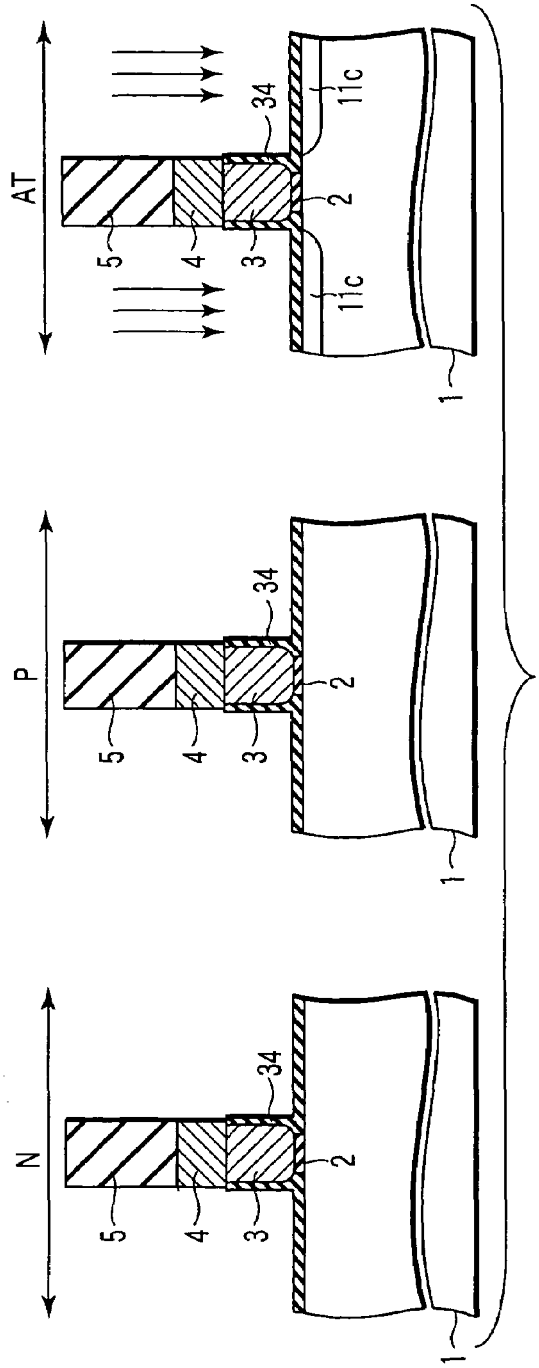

Next, as shown in FIG. 5, an oxide film 34 which is equal in thickness to the second portion 62 of the post-oxide film 6 is formed on the sidewalls of the gate electrodes 3 and over the entire surface of the semiconductor substrate 1 by means of rapid thermal oxidation (RTO). Of the oxide film 34, the portion formed on the sidewall of each gate electrode forms the first portion 61 and the portion located on the semiconductor substrate 1 right beside the gate electrode forms the second portion 62. Next, for example, P is implanted into the semiconductor substrate 1 through the oxide film 34 at 10 keV to form extension layers 11*c* of each array transistor.

Figure 6:
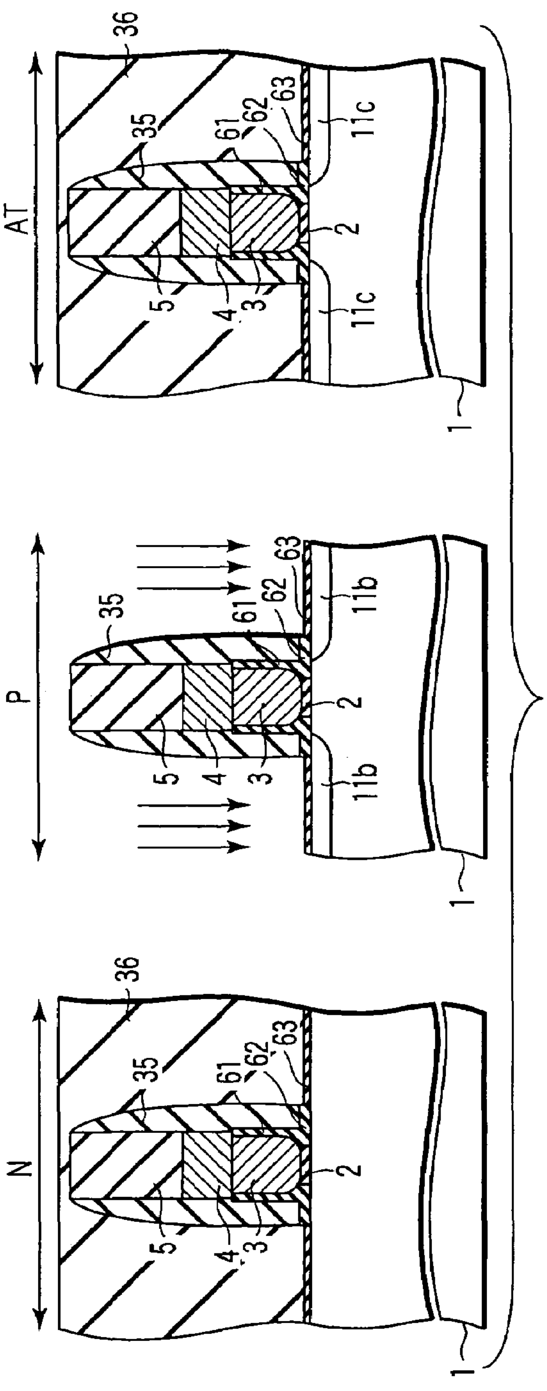

Next, as shown in FIG. 6, a film of a material for spacers 35 consisting of, say, boron silicate glass (BSG) is deposited over the entire surface of the semiconductor substrate 1. This material film is then etched back by RIE of different selectivity to the semiconductor substrate 1 to form the spacers 35. The width of the spacer may be within the range of 1 to 30 nm and is preferably within the range of 2 to 10 nm and more preferably 5 nm. One of the reasons for such width setting is to control the geometry of extension layers 11 formed by ion implantation using the spacer 35 as a mask. That is, it is for controlling diffusion from the edge of the spacer 35 to behave as desired in the direction of depth of the semiconductor substrate 1 and in the direction parallel to its surface (in the direction toward the channel).

When the material film is etched back, those portions of the oxide film 34 which are not covered with the spacers 35 are removed, thereby exposing the surface of the semiconductor substrate 1. As a consequence, the first and second portions 61 and 62 of the post-oxide film are formed. The third portion 63 of the post-oxide film is formed by natural oxidation of the exposed portions of the surface of the semiconductor substrate.

Next, a mask layer 36 having openings in the p-type transistor area P is formed by lithography and anisotropic etching such as RIE. Using this mask layer as a mask, for example, $BF_2$ is ion implanted into the semiconductor substrate through the third portion 63 at 7 keV to form extension layers 11*b*. At this point, since ion implantation is carried out through the third portion 36 which is nearly of zero thickness, high controllability of ion implantation is achieved. As the result, extension layers 11 which are uniform in size and shape and are small in diffusion depth are formed. After ion implantation, the mask layer 36 is removed.

Prior to the implantation of $BF_2$, for example, P may be implanted into the semiconductor substrate at an angle at 45 keV to form transistors of the halo structure. With the halo structure, though not shown, diffusion layers of the opposite conductivity type to the extension layers 11*b* are formed on the channel region side of the extension layers.

Figure 7:
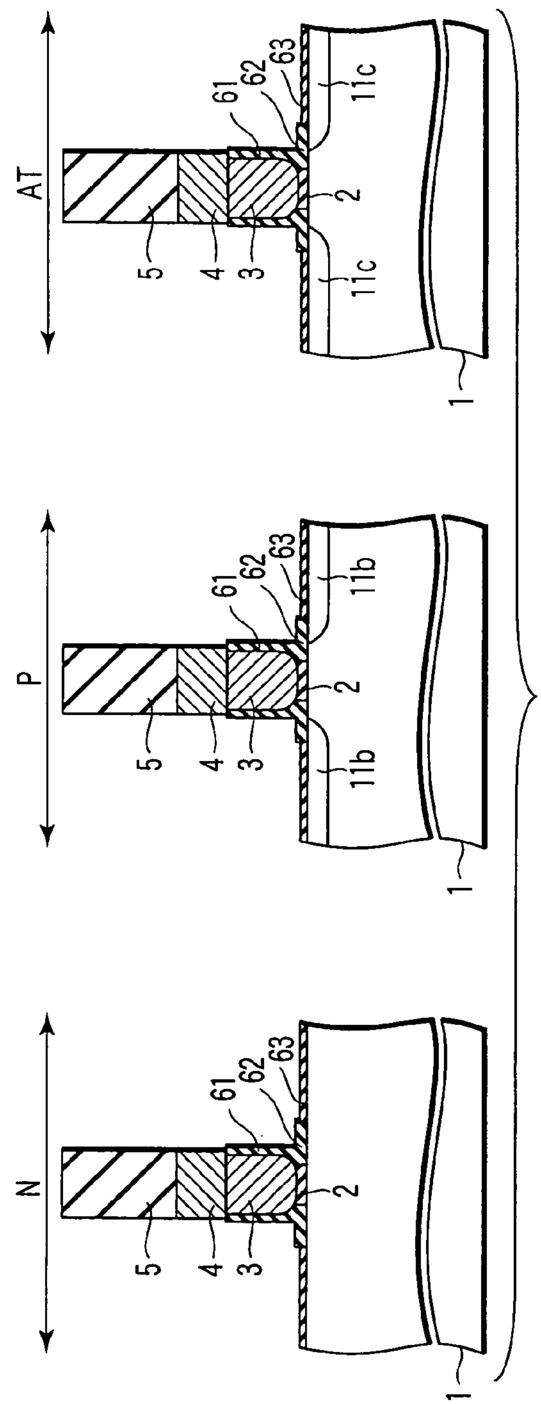
Figure 8:
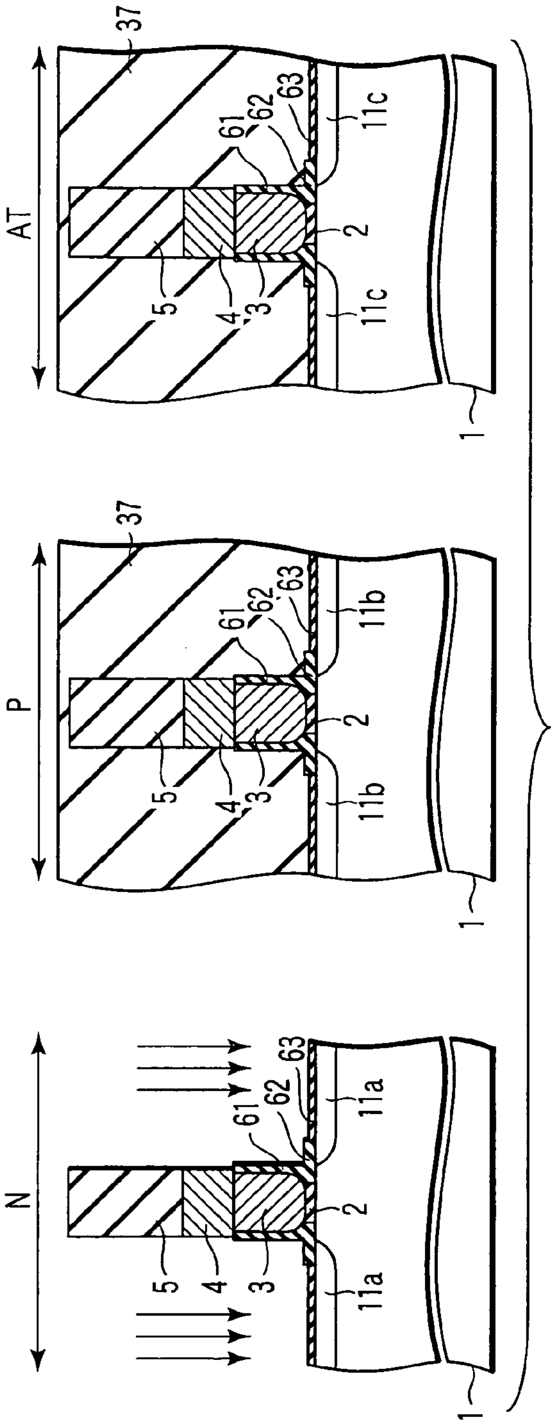

Next, as shown in FIG. 7, the spacer 35 is removed by HF vapor (vapor-phase HF). Next, as shown in FIG. 8, a mask layer 37 having openings in the n-type transistor area N is formed by means of lithography and anisotropic etching such as RIE. Using this mask layer as a mask, for example, As is ion implanted into the semiconductor substrate 1 through the third portion 63 at 7 keV to form extension layers 11*a*. Since the ion implantation is carried out through the third portion 63, extension layers 11*a* can be formed which are uniform in size and shape and are small in diffusion depth as with extension layers 11*b*. After ion implantation, the mask layer 37 is removed. Prior to the implantation of As, for example, B can be implanted into-the semiconductor substrate at an angle at 15 keV to form transistors of the halo structure.

Figure 9:
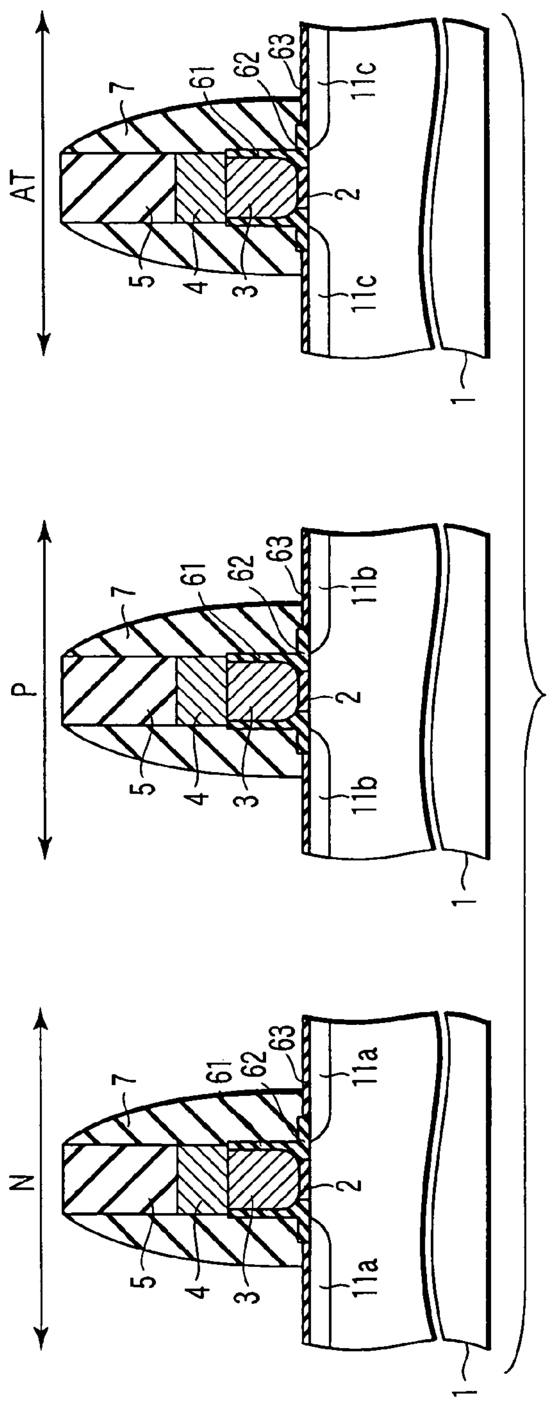

Next, as shown in FIG. 9, a film of a material for spacers 7 is deposited over the entire surface of the semiconductor substrate 1. This material film is then etched back by RIE of different selectivity to the semiconductor substrate 1 to form the spacers 7.

Figure 10:
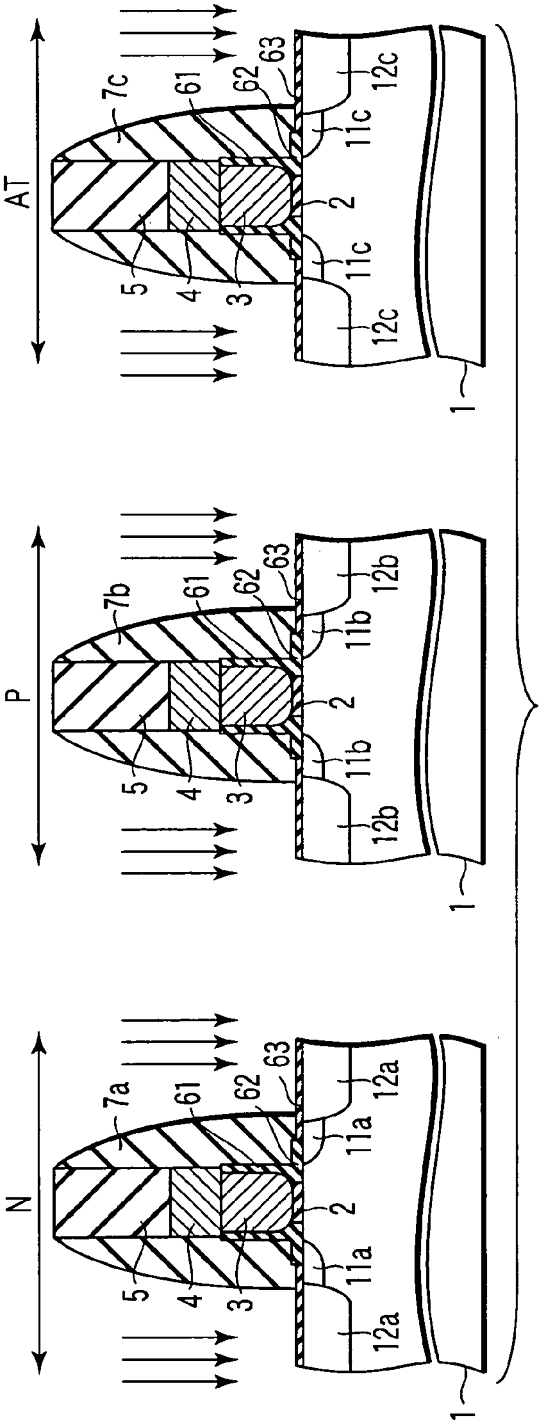

Next, as shown in FIG. 10, a mask layer (not shown) having openings in areas where the source/drain diffusion layers 12*c* are to be formed is formed by means of lithography and anisotropic etching such as RIE. Using this mask layer and the spacers 7*c* as a mask, for example, P is ion implanted into the semiconductor substrate to form the source/drain diffusion layers 12_c_. The mask layer is then removed.

Next, a mask layer (not shown) having openings in areas where source/drain diffusion layers 12_a_ are to be formed is formed by means of lithography and anisotropic etching such as RIE. Using this mask layer and the spacers 7_a_ as a mask, for example, As is ion implanted into the semiconductor substrate to form the source/drain diffusion layers 12_a_. The mask layer is then removed.

Next, a mask layer (not shown) having openings in areas where the source/drain diffusion layers 12_b_ are to be formed is formed by means of lithography and anisotropic etching such as RIE. Using this mask layer and the spacers 7_b_ as a mask, for example, $BF_2$ is ion implanted into the semiconductor substrate to form the source/drain diffusion layers 12_b_. The mask layer is then removed. Note here that the order in which the source/drain diffusion layers 12_a_, 12_b_ and 12_c_ are formed can be determined arbitrarily and the above order is merely exemplary.

Next, as shown in FIG. 1, a film of a material for the interlayer insulating film 13 is deposited over the entire surface of the semiconductor substrate 1 by means of CVD. This film is then subjected to a reflow process in, for example, a wet oxidizing atmosphere to form the interlayer insulating film 13. Next, in the array transistor area AT, contact holes for contacts 14 are formed by means of anisotropic etching such as RIE. The contact hole is formed between the spacers 7 of adjacent array transistors in a self-aligned manner. Next, amorphous silicon doped with, for example, P is deposited into the contact holes. The amorphous silicon is then planarized by CMP.

Next, contact holes for contact to the active areas and contact holes for contact to the gate electrodes 3 are formed by means of lithography and anisotropic etching such as RIE. Though not shown, a barrier metal film, consisting of a stacked film of, say, Ti and TiN, is then formed in these contact holes by means of CVD. The contact holes are then filled with, for example, W by means of sputtering to form contacts. Next, metal interconnections (not shown) are formed in a desired pattern in the interlayer insulating film 13.

According to the semiconductor device of the first embodiment, the post-oxide film 6 located on the surface of the semiconductor substrate 1 by the side of the gate electrode 3 is composed of two portions: the second portion 62 and the third portion 63. The third portion 63 is formed of native oxide and is therefore very thin. Since ion implantation to form the third portion, the controllability of ion implantation can be increased. Therefore, extension layers which are small in diffusion depth can be formed to provide transistors in which the short-channel effect is suppressed. In particular, ion implantation through the third portion 63 is carried out in forming the extension layers 11 of peripheral transistors, thus allowing high-performance peripheral transistors to be realized.

The thickness of the second portion 62, which depends on the thickness of the first portion 61, can be determined without being subject to the constraint that it should be made thin for the purpose of improving the controllability of ion implantation. Therefore, the thickness of the first portion 61 can be set so that the corners of the gate electrode is formed into a desired shape. Accordingly, the concentration of electric fields at the corners of the gate electrodes can be avoided, allowing transistors of little leakage current to be provided. That is, array transistors can be realized which are high in data holding capability.

As described above, according to the first embodiment, both array transistors which are high in data holding capability and peripheral transistors which suffer little from adverse effects of the short-channel effect can be realized.

SiN used as the sidewall spacers 7 increases tunnel leakage current on contact to silicon used as the semiconductor substrate 1; therefore, it is desirable that no contact be established between the spacer and the semiconductor substrate. According to the first embodiment, the provision of the third portion 63 allows the thickness of the post-oxide film 6 (the second portion 62) beside the gate electrode 6 to be secured while the post-oxide film 6 (the third portion 63) through which ions pass is made thin. That is, contact between the spacer 7 and the semiconductor substrate 1 can be prevented, allowing semiconductor devices which have little tunnel leakage current to be realized.

Second Embodiment

In the second-embodiment, the post-oxide film located on the surface of the semiconductor substrate 1 is comprised of the third portion 63 alone.

FIG. 11 is a schematic sectional view of a semiconductor device according to the second embodiment of the present invention. Although, in the second embodiment as well, array transistors and n- and p-type peripheral transistors are formed, only one transistor is illustrated in FIG. 11 as in the first embodiment. In FIG. 12 the portion enclosed by a circle in FIG. 11 is shown enlarged.

As shown in FIGS. 11 and 12, the third portion 63 of the post-oxide film extends from the position of contact to the first portion 61 to cover the source/drain diffusion layer 12. The thickness Lox of the gate insulating film 2, the width Lc of the first portion 61 and the thickness Lb of the third portion 63 remain unchanged from those in the first embodiment.

A method of manufacturing the semiconductor device shown in FIG. 11 will be described blow with reference to FIG. 13 through FIG. 16, which illustrate sectional views of the semiconductor device in the order of steps of manufacture thereof.

Figure 13:
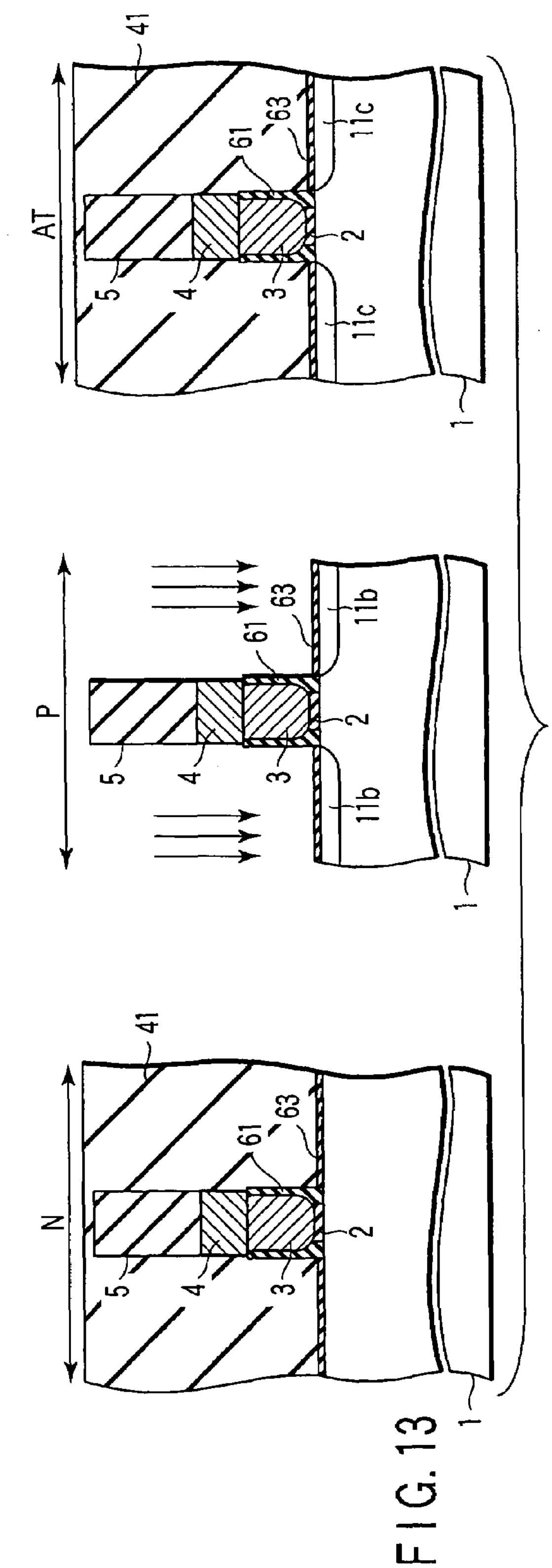

First, steps up to the steps in FIG. 5 in the first embodiment are carried out. Next, as shown in FIG. 13, portions of the oxide film 34 which are located on the surface of the semiconductor substrate 1 are removed by RIE under conditions of high-selectivity to silicon that forms the semiconductor substrate 1. After that, the third portion 63 of the post-oxide film is formed on the exposed surface of the semiconductor substrate 1 by natural oxidation.

Next, a mask layer 41 having openings in the p-type transistor area P is formed by means of lithography and anisotropic etching such as RIE. Using the mask layer 41 as a mask, extension layers 11_b_ are formed by ion implantation through the third portion 63 as in the case of FIG. 6 in the first embodiment. Since ion implantation is carried out only through the third portion 36 which is nearly of zero thickness, high controllability of ion implantation can be achieved. As the result, the extension layers 11_b_ which are uniform in size and shape and small in diffusion depth are formed. After ion implantation, the mask layer 36 is removed. It is also possible to carry out steps to form the p-type peripheral transistor into the halo structure as in the first embodiment.

Figure 14:
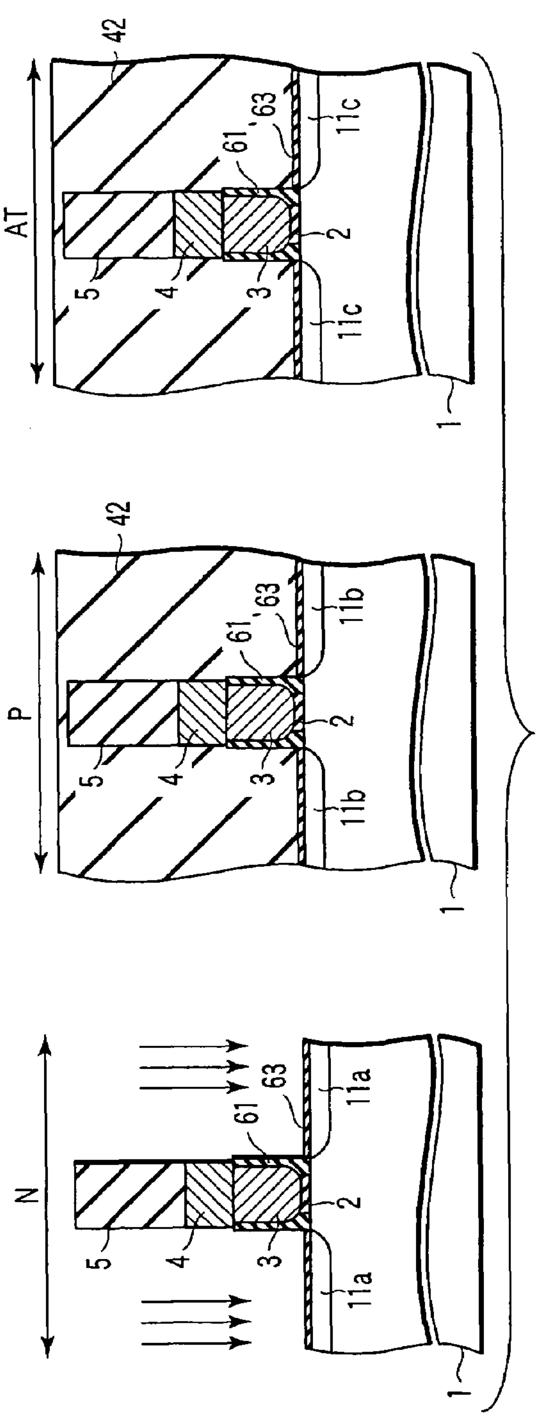

Next, as shown in FIG. 14, a mask layer 42 having openings in the n-type transistor area N is formed by means of lithography and anisotropic etching such as RIE. Using the mask layer 42 as a mask, extension layers 11_a_ are formed through the third portion by the same steps as those in FIG. 8 in the first embodiment. Since ion implantation is carried out through only the third portion 63 as in the case of the extension layers 11*a*, extension layers 11*a* which are uniform in size and shape and small in diffusion depth are formed. After ion implantation, the mask layer 42 is removed. It is also possible to carry out steps to form the n-type peripheral transistor into the halo structure as in the first embodiment.

Next, as shown in FIG. 15, the spacers 7 are formed by carrying out the same steps as in FIG. 9 in the first embodiment. Next, as shown in FIG. 16, the source/drain diffusion layers 12*a*, 12*b* and 12*c* are formed by carrying out the same steps as in FIG. 10 in the first embodiment. Next, the interlayer insulating film 13, the contacts 14 and the interconnection layers are formed in the same manner as in the first embodiment.

The semiconductor device according to the second embodiment of the present invention offers the same advantages as the first embodiment. In addition, in the second embodiment, ion implantation is performed through only the third portion 63 of the post-oxide film; therefore, the extension layers 11 can be formed with higher controllability than in the first embodiment. This allows the shape of the extension layer 11 to come close to a more desirable one even in the vicinity of the gate electrode 3.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a gate electrode provided on a gate insulating film formed on the surface of the semiconductor substrate;

a post-oxide film comprising a first portion, a second portion and a third portion, the first portion extending on a sidewall of the gate electrode to the surface of the semiconductor substrate, the second portion extending on the surface of the semiconductor substrate and contacting with the first portion, the third portion extending on the surface of the semiconductor substrate with its end contacting with an end of the second portion opposite to the first portion and thinner than the second portion;

a spacer covering a sidewall of the first portion on the second portion and the third portion;

source/drain extension layers formed in the surface of the semiconductor substrate under the second position and/or third portion and sandwiching a channel region under the gate electrode; and source/drain diffusion layers formed in the surface of the semiconductor substrate and contacting with ends of the source/drain extension layers opposite from the channel region.

2. The semiconductor device according to claim 1, wherein the semiconductor device includes an array transistor that forms a part of a memeory cell and a peripheral transistor that forms a part of a peripheral circuit, and the array transistor and the peripheral transistor have the gate electrode, the post-oxide film, the spacer, the source/drain extension layers, and the source/drain diffusion layers.

3. The semiconductor device according to claim 1, wherein the width of the spacer is no greater than 30 nm.

4. The semiconductor device according to claim 3, wherein the length of the second portion from its one end contacting with the first portion to its other end contacting with the third portion is no greater than 30 nm.

5. The semiconductor device according to claim 4, whrein the second portion is thicker than the first portion.

6. The semiconductor device according to claim 1, wherein the thickness of the second portion is no less than 10 nm.

7. The semiconductor device according to claim 6, wherein the thickness of the third portion is no greater than 10 n.

* * * * *